United States Patent
Wu et al.

(10) Patent No.: US 11,380,819 B2
(45) Date of Patent: Jul. 5, 2022

(54) MICRO LIGHT EMITTING DIODE AND MICRO LIGHT EMITTING DIODE DEVICE SUBSTRATE

(71) Applicant: PlayNitride Display Co., Ltd., MiaoLi County (TW)

(72) Inventors: Chih-Ling Wu, MiaoLi County (TW); Yi-Min Su, MiaoLi County (TW); Yen-Yeh Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 41 days.

(21) Appl. No.: 16/697,151

(22) Filed: Nov. 26, 2019

(65) Prior Publication Data

US 2021/0050479 A1    Feb. 18, 2021

(30) Foreign Application Priority Data

Aug. 16, 2019 (TW) .................. 108129201

(51) Int. Cl.
*H01L 33/24* (2010.01)
*H01L 25/075* (2006.01)
(Continued)

(52) U.S. Cl.
CPC .......... *H01L 33/24* (2013.01); *H01L 25/0753* (2013.01); *H01L 33/382* (2013.01); *H01L 33/58* (2013.01)

(58) Field of Classification Search
CPC ....... H01L 33/24; H01L 33/20; H01L 33/382; H01L 33/58; H01L 33/54; H01L 33/02; H01L 33/48; H01L 33/52
See application file for complete search history.

(56) References Cited

U.S. PATENT DOCUMENTS

2006/0043386 A1    3/2006    Furukawa et al.
2013/0026483 A1    1/2013    Sharma et al.
(Continued)

FOREIGN PATENT DOCUMENTS

CN    205508869    8/2016
CN    205790048    12/2016
(Continued)

OTHER PUBLICATIONS

"Office Action of China Counterpart Application", dated Apr. 28, 2020, p. 1-p. 7.

*Primary Examiner* — Marcos D. Pizarro
*Assistant Examiner* — Antonio B Crite
(74) *Attorney, Agent, or Firm* — JCIPRNET

(57) ABSTRACT

A micro light emitting diode including an epitaxial structure and two electrodes is provided. The epitaxial structure includes a first surface, a second surface and a side surface. The first surface is opposite to the second surface, and the side surface is connected to the first surface and the second surface. The side surface includes a first portion and a second portion. The first portion is connected to the second portion to form a turning position. A width of the epitaxial structure gradually increases from the first surface to the turning position and gradually decreases from the turning position to the second surface. The two electrodes are disposed on the epitaxial structure and are electrically connected to the epitaxial structure. A micro light emitting diode device substrate adopting the micro light emitting diode is also provided.

11 Claims, 3 Drawing Sheets

(51) Int. Cl.
*H01L 33/38* (2010.01)
*H01L 33/58* (2010.01)
*H01L 33/54* (2010.01)
*H01L 33/20* (2010.01)

(56) References Cited

U.S. PATENT DOCUMENTS

2014/0367705 A1* 12/2014 Bibi .................... H01L 33/0008
257/88
2015/0295131 A1* 10/2015 Saito .................... H01L 33/0075
257/76

FOREIGN PATENT DOCUMENTS

| | | |
|---|---|---|
| CN | 108649046 | 10/2018 |
| JP | H06163980 | 6/1994 |

* cited by examiner

MICRO LIGHT EMITTING DIODE AND MICRO LIGHT EMITTING DIODE DEVICE SUBSTRATE

CROSS-REFERENCE TO RELATED APPLICATION

This application claims the priority benefit of Taiwan application serial No. 108129201, filed on Aug. 16, 2019. The entirety of the above-mentioned patent application is hereby incorporated by reference herein and made a part of this specification.

BACKGROUND OF THE INVENTION

Field of the Invention

The disclosure relates to a light emitting diode with an epitaxial structure, and in particular, to a micro light emitting diode and a micro light emitting diode device substrate.

Description of Related Art

In recent years, as the manufacturing cost of an organic light-emitting diode (OLED) display panel is high and the service life thereof cannot compete with current mainstream displays, micro LED displays gradually attract investment from various technology companies. In addition to the advantages of low energy consumption and long service life of materials, the micro LED display also has excellent optical performance, such as high color saturation, fast response and high contrast.

In the manufacture process of the micro LED display, a pre-fabricated micro light emitting diode device is transferred from a temporary substrate to a circuit substrate of the display through a mass transfer technology. Generally, a sidewall of an epitaxial structure of the light emitting diode device forms a chamfered surface due to a patterning process. After the epitaxial structure is transferred onto the circuit substrate, the width thereof increases with a direction away from the circuit substrate. Therefore, in a subsequent manufacture process of a film (e.g., a conductive film or an insulating layer), the chamfered surface of the epitaxial structure is liable to cause film breakage or line disconnection, resulting in the decrease in the overall yield of the subsequent manufacture process. How to overcome the above problems has become an important issue for related manufacturers.

SUMMARY OF THE INVENTION

The invention provides a micro light emitting diode, which has better light extraction efficiency.

The invention provides a micro light emitting diode device substrate, which leads to a yield of a subsequent manufacture process.

The micro light emitting diode of the invention includes an epitaxial structure and two electrodes. The epitaxial structure includes a first surface, a second surface opposite to the first surface, and a side surface connected to the first surface and the second surface. The side surface includes a first portion and a second portion. The first portion is connected to the second portion to form a turning position. A width of the epitaxial structure gradually increases from the first surface to the turning position and gradually decreases from the turning position to the second surface. The two electrodes are disposed on the epitaxial structure and are electrically connected to the epitaxial structure.

In an embodiment of the invention, the epitaxial structure of the above micro light emitting diode includes a virtual plane that is parallel to the first surface and passes through the turning position. An included angle is provided between the first portion of the side surface and the virtual plane, and the included angle is between 100 degrees and 135 degrees.

In an embodiment of the invention, the first surface of the above micro light emitting diode has a first length in a direction, the second surface has a second length in the direction, and a ratio of the first length to the second length is between 0.8 and 1.2.

In an embodiment of the invention, a first vertical distance is provided between the second surface and the first surface of the above micro light emitting diode, a second vertical distance is provided between the second surface and the turning position, and a ratio of the second vertical distance to the first vertical distance is between 0.04 and 0.28.

In an embodiment of the invention, the two electrodes of the above micro light emitting diode are located on two opposite sides of the epitaxial structure, and one of the electrodes covers the second surface and the second portion of the side surface.

In an embodiment of the invention, the epitaxial structure of the above micro light emitting diode further includes a first-type semiconductor layer, a light emitting layer and a second-type semiconductor layer. The first-type semiconductor layer includes the first surface, the second-type semiconductor layer includes the second surface, and the turning position is located on the second-type semiconductor layer.

In an embodiment of the invention, the second-type semiconductor layer of the above micro light emitting diode has a vertical thickness, a vertical distance is provided between the turning position and the light emitting layer, and a ratio of the vertical distance to the vertical thickness is less than 1.

The micro light emitting diode device substrate of the invention includes a carrier and a plurality of micro light emitting diodes. The micro light emitting diodes are disposed on the carrier and each include an epitaxial structure and two electrodes. The epitaxial structure includes a first surface, a second surface opposite to the first surface, and a side surface connected to the first surface and the second surface. The side surface includes a first portion and a second portion. The first portion is connected to the second portion to form a turning position. A width of the epitaxial structure gradually increases from the first surface to the turning position and gradually decreases from the turning position to the second surface. The two electrodes are disposed on the epitaxial structure, and at least a portion of each of the electrodes directly contacts the epitaxial structure.

In an embodiment of the invention, the first surface of the above micro light emitting diode device substrate has a first length in a direction, the second surface has a second length in the direction, and a ratio of the first length to the second length is between 0.8 and 1.2.

In an embodiment of the invention, a first vertical distance is provided between the second surface and the first surface of the above micro light emitting diode device substrate, a second vertical distance is provided between the second surface and the turning position, and a ratio of the second vertical distance to the first vertical distance is between 0.04 and 0.28.

In an embodiment of the invention, the epitaxial structure of the above micro light emitting diode device substrate includes a virtual plane that is parallel to the first surface and passes through the turning position. An included angle is provided between the first portion of the side surface and the virtual plane, and the included angle is between 100 degrees and 135 degrees.

In an embodiment of the invention, the above micro light emitting diode device substrate further includes a planarization layer. The planarization layer is disposed on the carrier and covers the first portions of the side surfaces of the epitaxial structures.

In an embodiment of the invention, the two electrodes of the above micro light emitting diode device substrate are located on two opposite sides of the epitaxial structure, and one of the electrodes covers the second surface, the second portion of the side surface and the planarization layer while the other of the electrodes is located between the epitaxial structure and the carrier.

In an embodiment of the invention, the two electrodes of the above micro light emitting diode device substrate are located on a same side of the epitaxial structure.

In an embodiment of the invention, the above micro light emitting diode device substrate further includes an insulating layer. The insulating layer covers the second surface of the epitaxial structure, the second portion of the side surface and the planarization layer.

In an embodiment of the invention, the above micro light emitting diode device substrate further includes a lens structure overlapping the epitaxial structure. The lens structure and the insulating layer belong to a same film layer.

In an embodiment of the invention, the epitaxial structure of the above micro light emitting diode device substrate further includes a first-type semiconductor layer, a light emitting layer and a second-type semiconductor layer sequentially disposed on the carrier. The first-type semiconductor layer includes the first surface, the second-type semiconductor layer includes the second surface, and the turning position is located on the second-type semiconductor layer.

In an embodiment of the invention, the second-type semiconductor layer of the above micro light emitting diode device substrate has a vertical thickness, a vertical distance is provided between the turning position and the light emitting layer, and a ratio of the vertical distance to the vertical thickness is less than 1.

Based on the above, in the micro light emitting diode device substrate of an embodiment of the invention, the turning position is formed on the side surface that is connected to the first surface and the second surface. Since the width of the epitaxial structure gradually increases from the first surface to the turning position and gradually decreases from the turning position to the second surface, the risk of film breakage or line disconnection in a subsequent film-manufacturing process is reduced, which is conducive to improving the overall yield of the subsequent manufacture process. On the other hand, by means of a diamond-shaped epitaxial structure of the micro light emitting diode of an embodiment of the invention, the light extraction efficiency thereof is improved.

In order to make the aforementioned and other objectives and advantages of the invention comprehensible, embodiments accompanied with figures are described in detail below.

DESCRIPTION OF THE EMBODIMENTS

Figure 1:
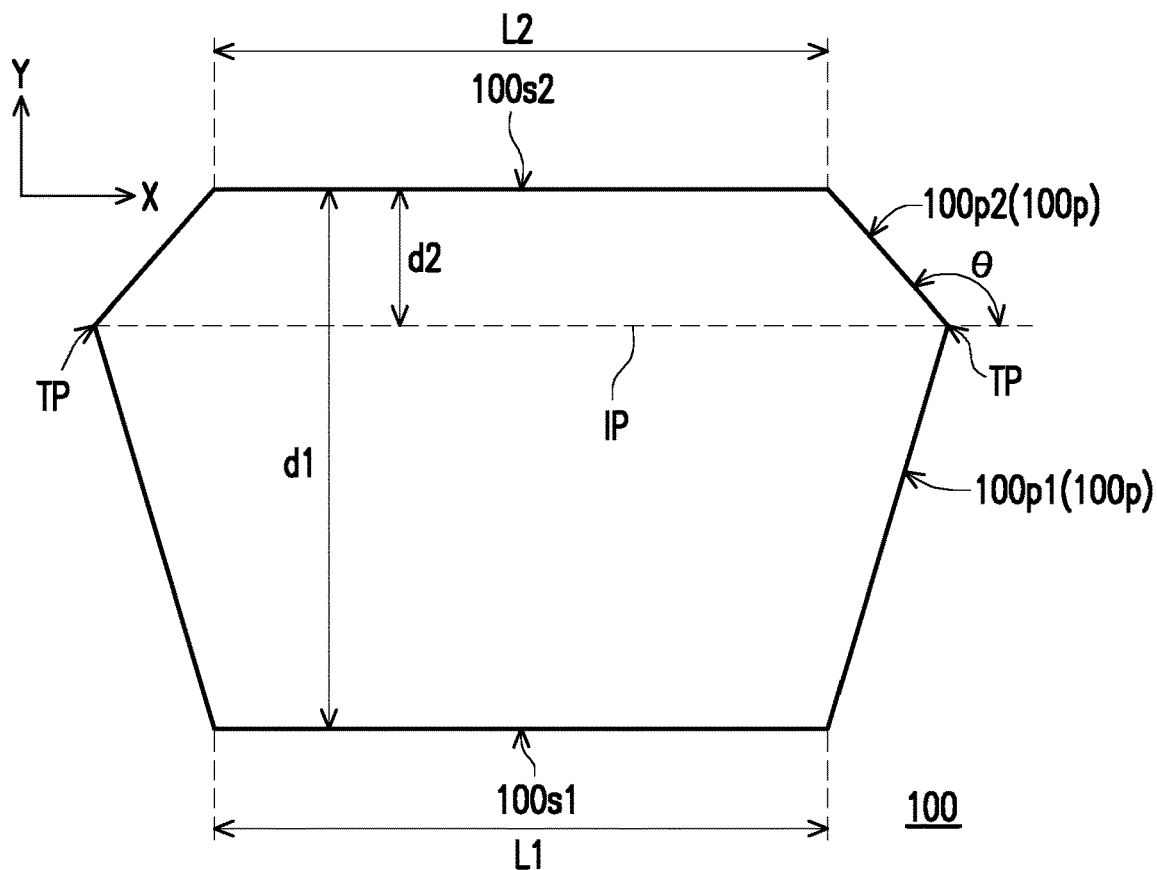
FIG. 1 is a schematic cross-sectional view of an epitaxial structure according to an embodiment of the invention.

Reference will now be made in detail to the present exemplary embodiments of the invention, examples of which are illustrated in the accompanying drawings. Wherever possible, the same reference numbers are used in the drawings and the description to refer to the same or like parts.

FIG. 1 is a schematic cross-sectional view of an epitaxial structure according to an embodiment of the invention. Referring to FIG. 1, an epitaxial structure 100 includes a first surface 100$s$1, a second surface 100$s$2 opposite to the first surface 100$s$1, and a side surface 100$p$ connected to the first surface 100$s$1 and the second surface 100$s$2. The side surface 100$p$ includes a first portion 100$p$1 and a second portion 100$p$2. The first portion 100$p$1 is connected to the second portion 100$p$2 and a turning position TP is provided. More specifically, the width of the epitaxial structure 100 in any direction (e.g., a direction X) parallel to the first surface 100$s$1 (or the second surface 100$s$2) gradually increases from the first surface 100$s$1 to the turning position TP and gradually decreases from the turning position TP to the second surface 100$s$2. That is, a portion, provided with the turning position TP, of the epitaxial structure 100 has the largest width in the direction X.

Further, the epitaxial structure 100 includes a virtual plane IP, and the virtual plane IP is parallel to the first surface 100$s$1 (or the second surface 100$s$2) and passes through the turning position TP of the side surface 100$p$. That is, the first portion 100$p$1 and the second portion 100$p$2 of the side surface 100$p$ are located on opposite sides of the virtual plane IP respectively. Specifically, an included angle θ is provided between the second portion 100$p$2 of the side surface 100$p$ and the virtual plane IP, and the included angle θ is greater than 90 degrees. In some exemplary embodiments, the included angle θ is in the range of 100 degrees to 135 degrees, but the invention is not limited thereto.

In the present embodiment, a first vertical distance d1 is provided between the first surface 100$s$1 and the second surface 100$s$2, a second vertical distance d2 is provided between the second surface 100$s$2 and the turning position TP, and a ratio of the second vertical distance d2 to the first vertical distance d1 is in the range of 0.04 to 0.28. For example, the thickness of the epitaxial structure 100 is less than 10 microns. In an exemplary embodiment, the first vertical distance d1 between the first surface 100$s$1 and the second surface 100$s$2 is between 6 and 8 microns, and the second vertical distance d2 between the second surface 100$s$2 and the turning position TP is between 1 and 2 microns. In another exemplary embodiment, the first vertical distance d1 between the first surface 100$s$1 and the second surface 100$s$2 is between 4 and 6 microns, and the second vertical distance d2 between the second surface 100$s$2 and the turning position TP is between 0.2 and 1 micron.

On the other hand, the first surface 100s1 and the second surface 100s2 of the epitaxial structure 100 have a first length L1 and a second length L2 in the direction X respectively, and a ratio of the first length L1 to the second length L2 is between 0.8 and 1.2. The ratio of the first length L1 to the second length L2 is less than 0.8 or greater than 1.2, which tends to cause yield loss of a transfer manufacture process and bonding. From another point of view, at least one cross section (e.g., an XY plane) of the epitaxial structure 100 exhibits a diamond-shaped configuration. Accordingly, the probability of total reflection of partial light beams generated inside the epitaxial structure 100 on the second portion 100p2 of the side surface 100p is reduced, which is conducive to improving the light extraction efficiency of the epitaxial structure 100. That is, the diamond-shaped epitaxial structure 100 has high light emitting brightness.

Some embodiments of the micro light emitting diode device substrate including the above epitaxial structure will be described in detail below. The same components will be denoted by the same reference numerals, and the description of the same technical content will be omitted. For the omitted portions, reference is made to the foregoing embodiments, and the descriptions thereof are omitted herein.

Figure 2A:
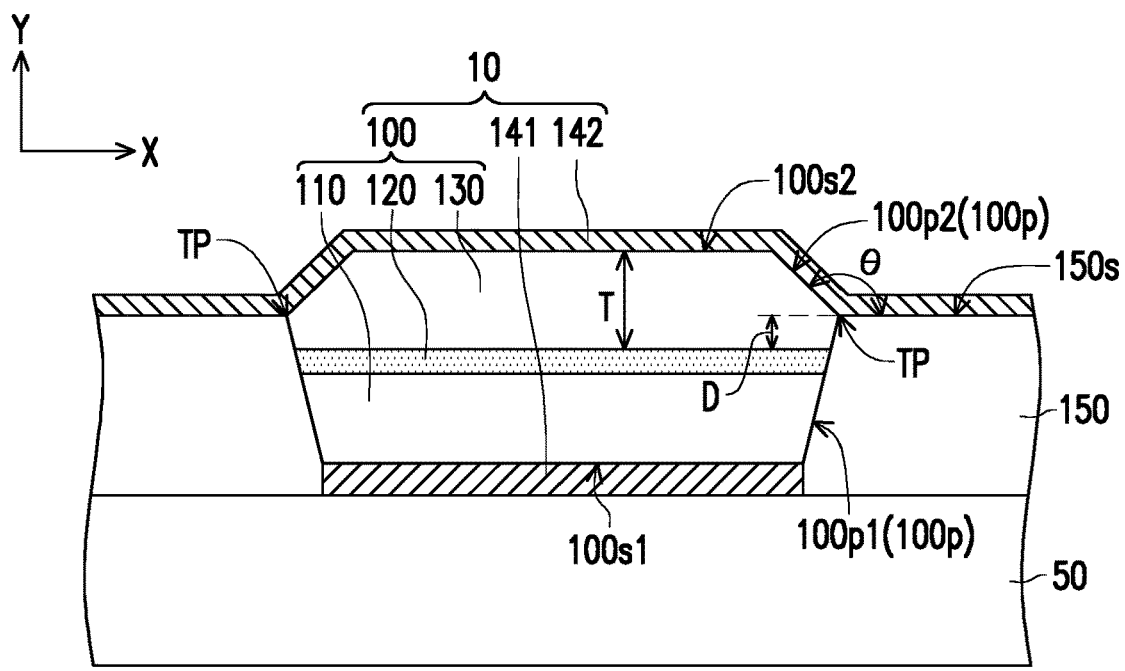
FIG. 2A is a schematic cross-sectional view of a micro light emitting diode device substrate according to an embodiment of the invention.
Figure 2B:
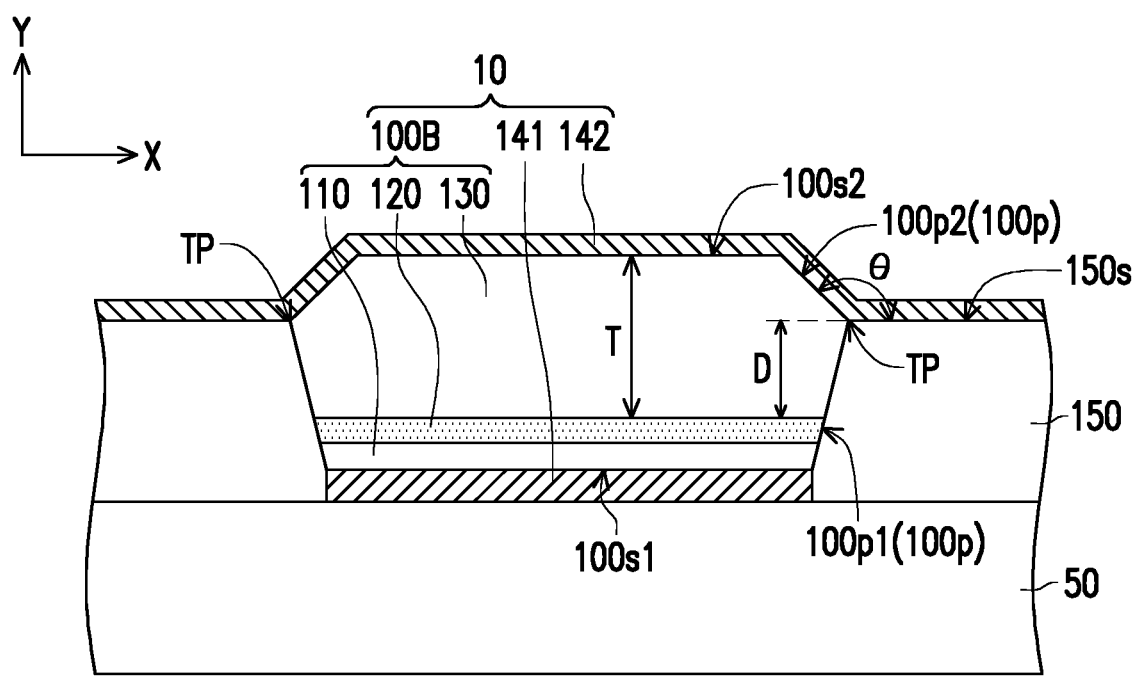
FIG. 2B is a schematic cross-sectional view of a micro light emitting diode device substrate according to another embodiment of the invention.

FIG. 2A is a schematic cross-sectional view of a micro light emitting diode device substrate according to an embodiment of the invention. FIG. 2B is a schematic cross-sectional view of a micro light emitting diode device substrate according to another embodiment of the invention. Referring to FIG. 2A, a micro light emitting diode device substrate 1 includes a carrier 50 and a micro light emitting diode 10. The micro light emitting diode 10 is disposed on the carrier 50 and electrically connected to the carrier 50. In the present embodiment, the carrier 50 is a circuit substrate. The circuit substrate is, for example, a complementary metal-oxide-semiconductor (CMOS) substrate, a liquid crystal on silicon (LCOS) substrate, a thin film transistor (TFT) substrate, or other substrates with a working circuit. However, the invention is not limited thereto. According to other embodiments, the carrier 50 is also a temporary substrate or carrier for transfer. More specifically, the micro light emitting diode device substrate 1 of the present embodiment is, for example, a micro light-emitting diode display (Micro LED Display) panel, and has a plurality of micro light emitting diodes 10. However, for the sake of clarity of presentation and description, exemplary descriptions will be made with taking one micro light emitting diode 10 of the present embodiment as an example, and the invention is not limited thereto.

Further, the micro light emitting diode device substrate 1 further includes a planarization layer 150 disposed on the carrier 50. In the present embodiment, the planarization layer 150 is located between any two adjacent micro light emitting diodes 10 (not shown), but the invention is not limited thereto. More specifically, the planarization layer 150 surrounds the epitaxial structure 100 of the micro light emitting diode 10 and covers the first portion 100p1 of the side surface 100p thereof. In the present embodiment, the epitaxial structure 100 includes a first-type semiconductor layer 110, a light emitting layer 120 and a second-type semiconductor layer 130 sequentially stacked on the carrier 50. The first-type semiconductor layer 110 includes the first surface 100s1, the second-type semiconductor layer 130 includes the second surface 100s2, and the turning position TP of the epitaxial structure 100 is located on the second-type semiconductor layer 130. That is to say, the first-type semiconductor layer 110, the light emitting layer 120 and at least a portion of the second-type semiconductor layer 130 are provided with the first portion 100p1 of the side surface 100p. The other portion of the second-type semiconductor layer 130 is provided with the second portion 100p2 of the side surface 100p.

On the other hand, the second-type semiconductor layer 130 has a vertical thickness T in a normal direction (e.g., a direction Y) of the carrier 50, a vertical distance D is provided between the turning position TP and the light emitting layer 120, and the vertical thickness T is greater than the vertical distance D. In the present embodiment, the first-type semiconductor layer 110 and the second-type semiconductor layer 130 are a P-type semiconductor and an N-type semiconductor, respectively. The light emitting layer 120 is a multiple quantum well (MQW) structure. But the invention is not limited thereto. For example, in the present embodiment, the first-type semiconductor layer 110 and the second-type semiconductor layer 130 have substantially the same thickness in the normal direction of the carrier 50. That is, the light emitting layer 120 of the epitaxial structure 100 is optionally located in an intermediate area between the first surface 100s1 and the second surface 100s2, but the invention is not limited thereto. In other embodiments, the first-type semiconductor layer 110 and the second-type semiconductor layer 130 also have different thicknesses in the normal direction of the carrier 50. For example, the vertical thickness of the second-type semiconductor layer 130 is greater than the vertical thickness of the first-type semiconductor layer 110. That is, the light emitting layer 120 of an epitaxial structure 100B of a micro light emitting diode device substrate 1A is closer to the first surface 100s1 (as shown in FIG. 2B).

In the present embodiment, the micro light emitting diode 10 further includes a first electrode 141 and a second electrode 142, and the two electrodes are respectively located on opposite sides of the epitaxial structure 100. That is, the micro light emitting diode 10 is a vertical type light emitting diode device, but the invention is not limited thereto. Specifically, the first electrode 141 is located between the first surface 100s1 of the epitaxial structure 100 and the carrier 50, and electrically connected to the first-type semiconductor layer 110 and the carrier 50. The second electrode 142 is disposed on the second surface 100s2 of the epitaxial structure 100 and the planarization layer 150, and electrically connected to the second-type semiconductor layer 130.

On the other hand, the second electrodes 142 of the plurality of micro light emitting diodes 10 of the micro light emitting diode device substrate 1 (e.g., micro LED display) are electrically connected to each other. That is, the second electrodes 142 are implemented by a common electrode, and the common electrode has a common electric potential. Specifically, the common electrode is electrically connected to the plurality of epitaxial structures 100 through the second surface 100s2 covering the plurality of epitaxial structures 100, the second portion 100p2 of the side surface 100p, and an upper surface 150s of the planarization layer 150. For example, the common electrode (i.e., the second electrode 142) has a film thickness of less than 1 micron. In an exemplary embodiment, the film thickness of the common electrode is in the range of 0.2 to 0.5 micron. In the present embodiment, the first electrode 141 optionally has a high potential. The second electrode 142 optionally has a ground potential or a low potential. A current generated by a potential difference between the two electrodes enables the epitaxial structure 100 to cause the light emitting layer 120 to emit a (visible) light beam. But the invention is not limited thereto.

Specifically, the turning position TP of the epitaxial structure 100 is substantially tangential to the upper surface 150s of the planarization layer 150. An included angle θ between the second portion 100p2 of the side surface 100p and the upper surface 150s of the planarization layer 150 is, but not limited to, between 100 degrees and 135 degrees. As a result, a junction between the first portion 100p1 of the side surface 100p and the planarization layer 150 has a more moderate topographical profile, which is conducive to reducing the risk of film breakage or line disconnection of the second electrode 142 at a joint between the second surface 100s2 of the epitaxial structure 100 and the side surface 100p, thereby improving the overall yield of a subsequent manufacture process. From another point of view, the film coverage of the epitaxial structure 100 is also increased.

Figure 3:
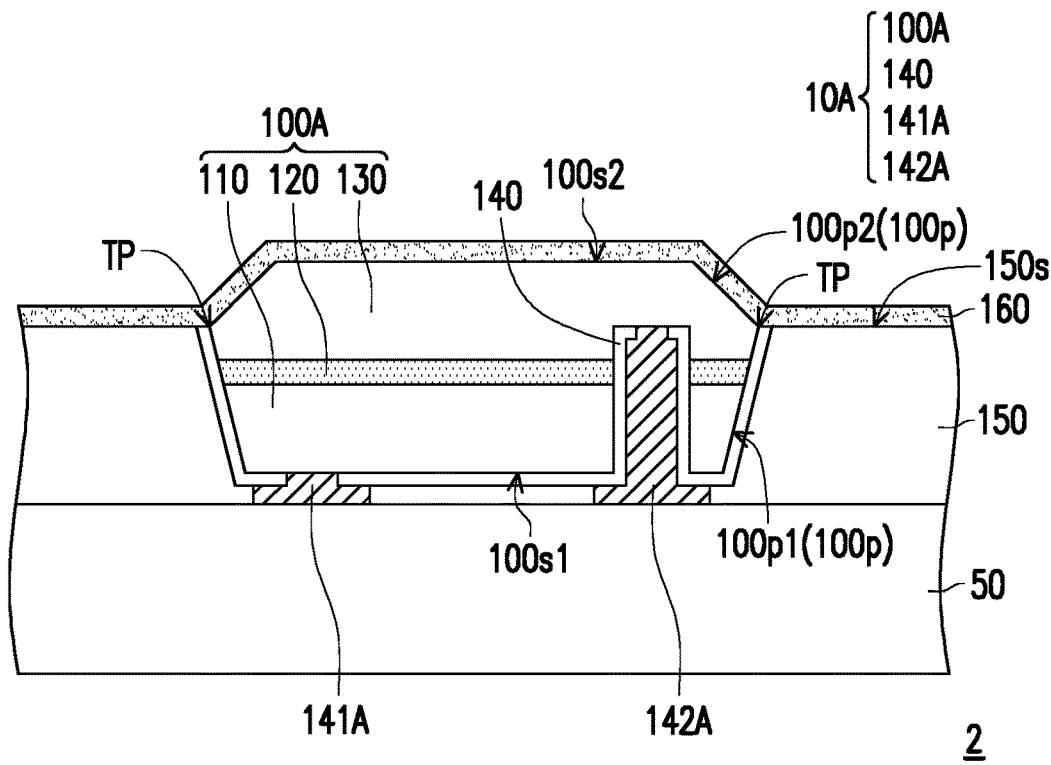
FIG. 3 is a schematic cross-sectional view of a micro light emitting diode device substrate according to still another embodiment of the invention.

FIG. 3 is a schematic cross-sectional view of a micro light emitting diode device substrate according to still another embodiment of the invention. Referring to FIG. 3, the main difference between a micro light emitting diode device substrate 2 of the present embodiment and the micro light emitting diode device substrate 1 of FIG. 2A is that the configuration modes of two electrodes are different. In the present embodiment, a first electrode 141A and a second electrode 142A of a micro light emitting diode 10A are disposed on the same side of an epitaxial structure 100A. The micro light emitting diode 10A further includes an insulating layer 140. For example, the insulating layer 140 is located between the epitaxial structure 100A (or the planarization layer 150) and the carrier 50, and covers the first-type semiconductor layer 110, the light emitting layer 120 and a portion of the second-type semiconductor layer 130. The first electrode 141A and the second electrode 142A are disposed between the epitaxial structure 100A and the carrier 50. The first electrode 141A penetrates the insulating layer 140 to be electrically connected to the first-type semiconductor layer 110. The second electrode 142A penetrates the insulating layer 140, the first-type semiconductor layer 110, the light emitting layer 120, and a portion of the second-type semiconductor layer 130 to be electrically connected to the second-type semiconductor layer 130.

Further, the micro light emitting diode device substrate 2 further includes an insulating layer 160. The insulating layer 160 covers the second surface 100s2 of the epitaxial structure 100A, the second portion 100p2 of the side surface 100p and the upper surface 150s of the planarization layer 150. For example, the insulating layer 160 has a film thickness of less than 1 micron. In an exemplary embodiment, the film thickness of the insulating layer 160 is in the range of 0.2 to 0.5 micron. It is worth mentioning that since the micro light emitting diode 10A includes the diamond-shaped epitaxial structure 100A, the junction between the first portion 100p1 of the side surface 100p and the planarization layer 150 has a more moderate topographical profile. Accordingly, the risk of film breakage or line disconnection of the insulating layer 160 at a joint between the second surface 100s2 of the epitaxial structure 100A and the side surface 100p is favorably reduced, thereby improving the overall yield of a subsequent manufacture process.

Figure 4:
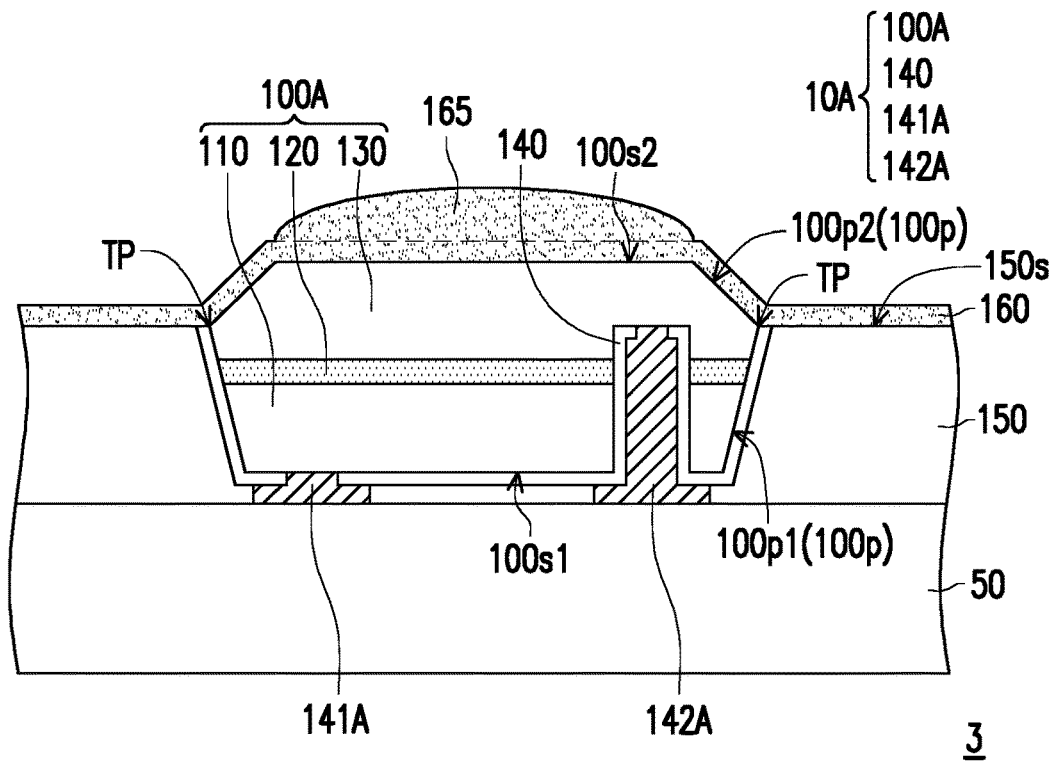
FIG. 4 is a schematic cross-sectional view of a micro light emitting diode device substrate according to a further embodiment of the invention.

FIG. 4 is a schematic cross-sectional view of a micro light emitting diode device substrate according to a further embodiment of the invention. Referring to FIG. 4, the main difference between a micro light emitting diode device substrate 3 of the present embodiment and the micro light emitting diode device substrate 2 of FIG. 3 is that the micro light emitting diode device substrate 3 also optionally includes a lens structure 165. The lens structure 165 overlaps the epitaxial structure 100A. In the present embodiment, the materials of the lens structure 165 and the insulating layer 160 are the same. That is, the lens structure 165 and the insulating layer 160 belong to the same film layer, but the invention is not limited thereto. In other embodiments, the lens structure 165 and the insulating layer 160 may also belong to different materials. It is worth mentioning that, through the arrangement of the lens structure 165, the light emitting pattern of the epitaxial structure 100A is changed, thereby improving the directional concentration of light emitted from the micro light emitting diode 10A.

Based on the above, in the micro light emitting diode device substrate of an embodiment of the invention, the turning position is formed on the side surface that is connected to the first surface and the second surface. Since the width of the epitaxial structure gradually increases from the first surface to the turning position and gradually decreases from the turning position to the second surface, the risk of film breakage or line disconnection in a subsequent film-manufacturing process is reduced, which is conducive to improving the overall yield of the subsequent manufacture process. On the other hand, by means of the diamond-shaped epitaxial structure of the micro light emitting diode of an embodiment of the invention, the light extraction efficiency thereof is improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A micro light emitting diode device substrate, comprising:
   a carrier; and
   a plurality of micro light emitting diodes, disposed on the carrier, each of the micro light emitting diodes comprising:
   an epitaxial structure, comprising a first surface, a second surface opposite to the first surface, and a side surface connected to the first surface and the second surface, the side surface comprising a first portion and a second portion, the first portion being connected to the second portion to form a turning position, wherein a width of the epitaxial structure gradually increases from the first surface to the turning position and gradually decreases from the turning position to the second surface;
   a first electrode and a second electrode, wherein the first electrode is located between the first surface of the epitaxial structure and the carrier, the second electrode is disposed on the second surface of the epitaxial structure and a planarization layer, and the turning position is aligned to an upper surface the planarization layer.

2. The micro light emitting diode device substrate according to claim 1, wherein the first surface has a first length in a direction, the second surface has a second length in the direction, and a ratio of the first length to the second length is between 0.8 and 1.2.

3. The micro light emitting diode device substrate according to claim 1, wherein a first vertical distance is provided between the second surface and the first surface, and a ratio of the second vertical distance to the first vertical distance is between 0.04 and 0.28.

4. The micro light emitting diode device substrate according to claim 1, wherein the epitaxial structure comprises a virtual plane that is parallel to the first surface and passes through the turning position, an included angle is provided between the first portion of the side surface and the virtual plane, and the included angle is between 100 degrees and 135 degrees.

5. The micro light emitting diode device substrate according to claim 1, wherein the epitaxial structure further comprises a first-type semiconductor layer, a light emitting layer and a second-type semiconductor layer sequentially disposed on the carrier, the first-type semiconductor layer comprises the first surface, the second-type semiconductor layer comprises the second surface, and the turning position is located on the second-type semiconductor layer.

6. The micro light emitting diode device substrate according to claim 5, wherein the second-type semiconductor layer has a vertical thickness, a vertical distance is provided between the turning position and the light emitting layer, and a ratio of the vertical distance to the vertical thickness is less than 1.

7. The micro light emitting diode device substrate according to claim 1, wherein the planarization layer is disposed on the carrier and covers the first portions of the side surfaces of the epitaxial structures.

8. The micro light emitting diode device substrate according to claim 7, wherein the first and second electrodes are located on two opposite sides of the epitaxial structure, and one of the first and second electrodes covers the second surface, the second portion of the side surface and the planarization layer while the other of the first and second electrodes is located between the epitaxial structure and the carrier.

9. The micro light emitting diode device substrate according to claim 7, wherein the first and second electrodes are located on a same side of the epitaxial structure.

10. The micro light emitting diode device substrate according to claim 9, further comprising:
an insulating layer, covering the second surface of the epitaxial structure, the second portion of the side surface and the planarization layer.

11. The micro light emitting diode device substrate according to claim 10, further comprising:
a lens structure, overlapping the epitaxial structure, the lens structure and the insulating layer belonging to a same film layer.

* * * * *